(12) United States Patent
Choi et al.

(10) Patent No.: US 8,471,241 B2
(45) Date of Patent: Jun. 25, 2013

(54) LIGHT EMITTING DEVICE, LIGHT EMITTING DEVICE PACKAGE, AND LIGHTING SYSTEM

(75) Inventors: Kwang Ki Choi, Seoul (KR); Hwan Hee Jeong, Seoul (KR); Sang Youl Lee, Seoul (KR); June O Song, Seoul (KR); Ji Hyung Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 247 days.

(21) Appl. No.: 13/049,126

(22) Filed: Mar. 16, 2011

(65) Prior Publication Data

US 2011/0248237 A1 Oct. 13, 2011

(30) Foreign Application Priority Data

Apr. 12, 2010 (KR) .................. 10-2010-0033490

(51) Int. Cl.
*H01L 33/06* (2010.01)
(52) U.S. Cl.
USPC .............. 257/13; 257/98; 257/99; 257/94; 257/E33.008; 257/E33.056; 438/26; 438/28; 438/29; 438/123; 438/14
(58) Field of Classification Search
USPC ............ 257/13, E33.008, 98, E33.056, 99, 257/88, 94, 737; 438/26, 28, 29, 613, 123, 438/14
See application file for complete search history.

(56) References Cited

U.S. PATENT DOCUMENTS

| | | | |
|---|---|---|---|
| 6,340,824 B1 | 1/2002 | Komoto et al. | 257/99 |
| 2008/0029761 A1 | 2/2008 | Peng | 257/43 |
| 2009/0173963 A1 | 7/2009 | Hsu et al. | 257/99 |
| 2010/0038668 A1 | 2/2010 | Noma | 257/98 |
| 2010/0117070 A1* | 5/2010 | Adekore et al. | 257/43 |
| 2011/0220937 A1* | 9/2011 | Jeong et al. | 257/98 |
| 2011/0254046 A1* | 10/2011 | Hsu et al. | 257/99 |

FOREIGN PATENT DOCUMENTS

| | | |
|---|---|---|
| JP | 08-102549 A | 4/1996 |
| JP | 11-145519 A | 5/1999 |
| KR | 10-2007-0079957 A | 8/2007 |
| KR | 10-2008-0065666 A | 7/2008 |
| WO | WO 2005/091388 A1 | 9/2005 |

OTHER PUBLICATIONS

European Search Report dated Jul. 5, 2011 issued in Application No. 11 15 9580.

* cited by examiner

*Primary Examiner* — Cathy N Lam
(74) *Attorney, Agent, or Firm* — KED & Associates LLP

(57) ABSTRACT

Provided are a light emitting device, a light emitting device package, and a lighting system. The light emitting device includes a light emitting structure layer, a conductive layer, a bonding layer, a support member, first and second pads, and first and second electrodes. The light emitting structure layer includes a first conductive type semiconductor layer, an active layer, and a second conductive type semiconductor layer. The conductive layer is disposed under the light emitting structure layer. The bonding layer is disposed under the conductive layer. The support member is disposed under the bonding layer. The first pad is disposed under the support member. The second pad is disposed under the support member at a distance from the first pad. The first electrode is connected between the first conductive type semiconductor layer and the first pad. The second electrode is connected between the bonding layer and the second pad.

20 Claims, 10 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0033490 filed on Apr. 12, 2010, which is hereby incorporated by reference in its entirety.

BACKGROUND

The present disclosure relates to a light emitting device, a light emitting device package, and a lighting system.

Due to physical and chemical characteristics, group III-V nitride semiconductors are being considered as core materials for light-emitting devices such as light-emitting diodes (LEDs) and laser diodes (LDs). Generally, group III-V nitride semiconductors are formed of a semiconductor material having a compositional formula of $In_xAl_yGa_{1-x-y}N$ ($0 \leq x \leq 1$, $0 \leq y \leq 1$, $0 \leq x+y \leq 1$).

LEDs are a kind of semiconductor device that is used as a light source or uses the characteristics of compound semiconductors to convert electricity into infrared rays or light, thereby receiving or transmitting signals.

These semiconductor based LEDs or LDs are widely used in light-emitting devices, and are applied as light sources for various products such as keypad light-emitting units of mobile phones, electric light panels, and illumination devices.

SUMMARY

Embodiments provide a light emitting device having a new electrode structure.

Embodiments provide a light emitting device, in which a light emitting structure layer is disposed on a support member, and pads having different polarities are disposed under the support member.

Embodiments provide a light emitting device package including a light emitting device, and a lighting system.

In one embodiment, a light emitting device including: a light emitting structure layer including a first conductive type semiconductor layer, an active layer under the first conductive type semiconductor layer, and a second conductive type semiconductor layer under the active layer; a conductive layer under the light emitting structure layer; a bonding layer under the conductive layer; a support member under the bonding layer; a first pad under the support member; a second pad under the support member at a distance from the first pad; a first electrode connected between the first conductive type semiconductor layer and the first pad; and a second electrode connected between the bonding layer and the second pad.

In another embodiment, a light emitting device including: a light emitting structure layer including a first conductive type semiconductor layer, an active layer under the first conductive type semiconductor layer, and a second conductive type semiconductor layer under the active layer; a conductive layer under the light emitting structure layer; a bonding layer under the conductive layer; a support member under the bonding layer; a first pad under the support member; a second pad under the support member; a first electrode connected between the first conductive type semiconductor layer and the first pad; and a second electrode connected between the bonding layer and the second pad, wherein a width of the bonding layer is at least 50% of a width of the light emitting structure layer.

In further another embodiment, a light emitting device package including: a body; first and second lead frames in the body; a light emitting device disposed on the first and second lead frames and electrically connected to the first and second lead frames; and a molding member on the light emitting device, wherein the light emitting device includes: a light emitting structure layer including a first conductive type semiconductor layer, an active layer under the first conductive type semiconductor layer, and a second conductive type semiconductor layer under the active layer; a conductive layer under the light emitting structure layer; a bonding layer under the conductive layer; a support member under the bonding layer; a first pad disposed under the support member and connected to a topside of the first lead frame; a second pad disposed at a position under the support member and on the second lead frame; a first electrode connected between the first conductive type semiconductor layer and the first pad; and a second electrode connected between the bonding layer and the second pad.

The details of one or more embodiments are set forth in the accompanying drawings and the description below. Other features will be apparent from the description and drawings, and from the claims.

DETAILED DESCRIPTION OF THE EMBODIMENTS

Figure 1:
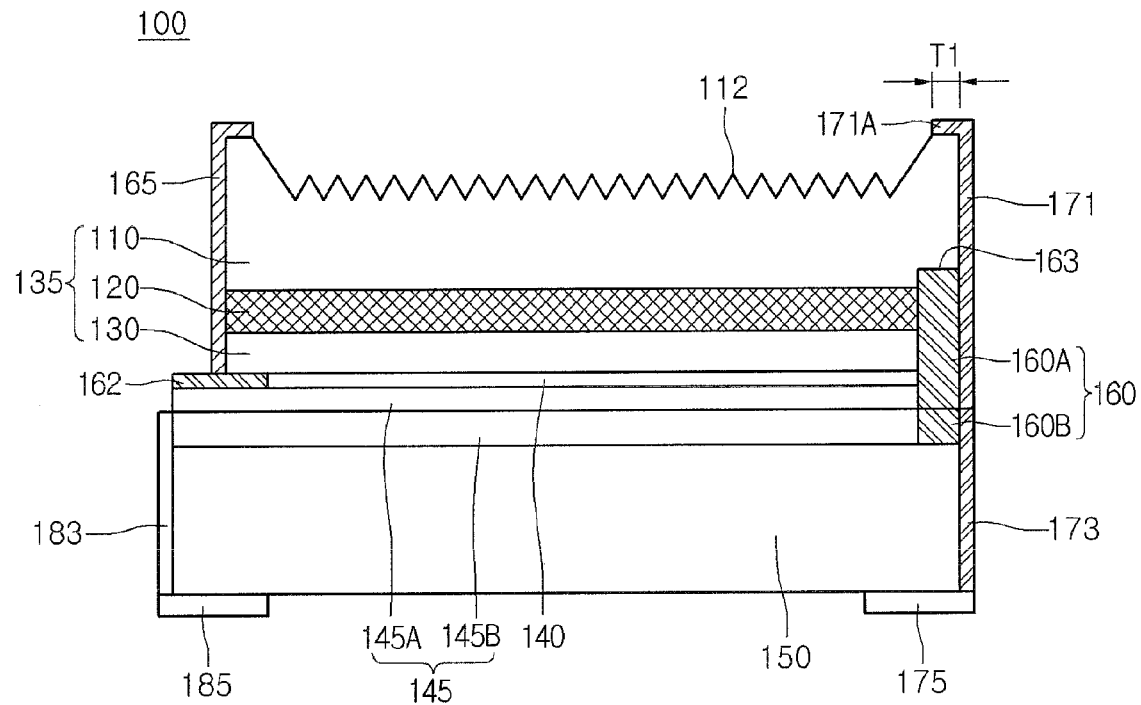
FIG. 1 is a side sectional view illustrating a light emitting device according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, exemplary embodiments will be described with reference to the accompanying drawings.

FIG. 1 is a side sectional view illustrating a light emitting device 100 according to a first embodiment.

Referring to FIG. 1, the light emitting device 100 includes a light emitting structure layer 135, a conductive layer 140, a bonding layer 145, a support member 150, a first insulating member 160, a second insulating member 165, first electrodes 171 and 173, a second electrode 183, a first pad 175, and a second pad 185.

The light emitting device 100 includes a light emitting diode (LED) including a plurality of compound semiconductor layers such as group III-V compound semiconductor layers. The LED may emit visible light such as blue, green, or red light or ultraviolet (UV) light. The LED may emit light by using a variety of semiconductors in the technical scope of the embodiment.

The light emitting device 100 includes a structure in which the light emitting structure layer 135 is disposed above the support member 150 and the different pads 175 and 185 are disposed under the support member 150.

The light emitting structure layer 135 includes a plurality of compound semiconductor layers, and the compound semiconductor layers include a first conductive type semiconductor layer 110, an active layer 120, and a second conductive type semiconductor layer 130.

The first conductive type semiconductor layer 110 may have a single-layer or multilayer structure, and at least one layer of the light emitting device 100 may include a first conductive type dopant.

The first conductive type semiconductor layer 110 may be formed of a group III-V compound semiconductor such as GaN, AlN, AlGaN, InGaN, InN, InAlGaN, AlInN, AlGaAs, GaP, GaAs, GaAsP, and AlGaInP. The first conductive type semiconductor layer 110 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 110 may be an N-type semiconductor layer. The N-type semiconductor layer may include an N-type dopant as a first conductive type dopant, such as Si, Ge, Sn, Se, and Te.

The first conductive type semiconductor layer 110 may have a super lattice structure in which semiconductor layers having different band gaps are stacked. The super lattice structure includes a structure such as a GaN/InGaN structure or a GaN/AlGaN structure. The super lattice structure may include a structure in which at least two pairs of different layers each having a thickness of about several angstroms (Å) or more are alternately stacked.

The area (or width) of the first conductive type semiconductor layer 110 may be greater than that of the active layer 120, but is not limited thereto.

The first conductive type semiconductor layer 110 includes a light extraction structure 112. The light extraction structure 112 may be formed at the top surface of the first conductive type semiconductor layer 110. The light extraction structure 112 includes a structure such a rough structure, a concave-convex pattern, or a texture pattern formed on at least a region of the stop surface of the first conductive type semiconductor layer 110. The sectional shape of the structure may include a horn or pillar shape. The light extraction structure 112 may change the critical angle of light incident on the top surface of the first conductive type semiconductor layer 110 to improve light extraction efficiency. The inner region of the top surface of the first conductive type semiconductor layer 110 may have a height different from the outer region of the top surface of the first conductive type semiconductor layer 110.

A current diffusion layer may be formed on the top surface of the first conductive type semiconductor layer 110. The current diffusion layer may include a metal oxide or a metal nitride. For example, the current diffusion layer may be formed of a material such as ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, and Ni/IrOx/Au/ITO. However, a material for the current diffusion layer is not limited to the listed materials. The current diffusion layer may be formed of a transparent conductive material.

The current diffusion layer may be electrically connected to the first electrode 171. For example, at least a portion of the current diffusion layer may be disposed between the first electrode 171 and the first conductive type semiconductor layer 110.

The active layer 120 is disposed under the first conductive type semiconductor layer 110. The active layer 120 may has one of a single quantum well structure, a multi quantum well structure, a quantum wire structure, and a quantum dot structure. The active layer 120 may have a period of a well layer and a barrier layer formed by group III-V compound semiconductor materials. The well layer may be a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may be a semiconductor layer having a compositional formula of $In_xAl_yGa_{1-x-y}N$ ($0 \leq x \leq 1$, $0 \leq y \leq 1$, $0 \leq x+y \leq 1$). For example, the active layer 120 may include at least one of an InGaN/GaN structure, an InGaN/AlGaN structure, and an InGaN/InGaN structure. The barrier layer may be formed of a material having a band gap greater than that of the well layer, but is not limited thereto.

A first conductive type clad layer may be disposed between the first conductive type semiconductor layer 110 and the active layer 120. The first conductive type clad layer may include an N-type semiconductor layer. The first conductive type clad layer may be formed of a GaN-based semiconductor. The first conductive type clad layer has a band gap greater than that of the barrier layer of the active layer 120 and functions to confine carriers.

A second conductive type clad layer may be disposed between the active layer 120 and the second conductive type semiconductor layer 130. The second conductive type clad layer may be formed f a GaN-based semiconductor. The second conductive type clad layer has a band gap greater than that of the barrier layer of the active layer 120 and functions to confine carriers.

The second conductive type semiconductor layer 130 is disposed under the active layer 120. The second conductive type semiconductor layer 130 may include a group III-V compound semiconductor and doped with a second conductive type dopant. If the second conductive type semiconductor layer 130 is a P-type semiconductor layer, the second conductive type semiconductor layer 130 may be formed of one of compound semiconductors such as GaN, InN, AlN, InGaN, AlGaN, InAlGaN, and AlInN. The second conductive type dopant may include a P-type dopant such as Mg, Zn, Ca, Sr, and Ba.

The second conductive type semiconductor layer 130 may be formed of a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 130 may have a single-layer or multilayer structure. When the second conductive type semiconductor layer 130 has a multi-layered structure, the second conductive type semiconductor layer 130 may have a super lattice structure such as an AlGaN/GaN structure or a stacked structure of layers having different dopant concentrations.

A third conductive type semiconductor layer may be formed under the second conductive type semiconductor layer 130. For example, the third conductive type semiconductor layer may have a polarity opposite to that of the second conductive type. For example, the third conductive type semiconductor layer may be formed of one of compound semiconductor materials such as GaN, InN, AlN, InGaN, AlGaN, InAlGaN, and AlInN. For example, the first conductive type semiconductor layer 110 and the third conductive type semiconductor layer may formed as N-type semiconductor layers, respectively.

The thickness of the first conductive type semiconductor layer 110 may be greater than at least the thickness of the active layer 120 or the second conductive type semiconductor layer 130.

The light emitting structure layer 135 may include the first conductive type semiconductor layer 110, the active layer 120, and the second conductive type semiconductor layer 130. The light emitting structure layer 135 may further include the third conductive type semiconductor layer. Also, the first conductive type semiconductor layer 110 may be formed as a P-type semiconductor layer, and the second conductive type semiconductor layer 130 may be formed as an N-type semiconductor layer.

The light emitting structure layer 135 may have at least one of an N-P junction structure, a P-N junction structure, an N-P-N junction structure, and a P-N-P junction structure. Hereinafter, a structure in which the second conductive type semiconductor layer 130 is the uppermost layer of the light emitting structure layer 135 will be described as an example. A light extraction structure such as a rough structure or a concave-convex pattern may be formed at the lower surface of the second conductive type semiconductor layer 130.

The conductive layer 140 is disposed under the second conductive type semiconductor layer 130, and the bonding layer 145 is disposed under the conductive layer 140. The support member 150 is disposed under the bonding layer 145.

The conductive layer 140 may include a conductive contact layer. For example, the conductive layer 140 may includes at least one conductive layer or a plurality of conductive layers.

The conductive layer 140 may include an ohmic contact layer and/or a reflective layer. The ohmic contact layer may be a layer or a plurality of patterns. The ohmic contact layer may include at least one of a metal, a metal oxide, and a metal nitride for ohmic properties. For example, the ohmic contact layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, Ni/IrOx/Au/ITO, Pt, Ni, Au, Rh, and Pd. The reflective layer may formed into a single-layer structure or a multilayer structure by using at least one of Ag, Ni, Al, Rh, Pd, Ir, Ru, Mg, Zn, Pt, Au, Hf, and an alloy thereof The reflective layer may be disposed between the ohmic contact layer and the bonding layer 145, but is not limited thereto.

In addition, a conductive or insulating pattern may be formed between the conductive layer 140 and the second conductive type semiconductor layer 130 by using an oxide. In this case, a resistance difference between a contact surface and another region may be reduced.

In addition, an interface between the conductive layer 140 and a first bonding layer 145A may include a concave-convex structure to improve bonding between the conductive layer 140 and the first bonding layer 145A.

The bonding layer 145 is formed between the support member 150 and the conductive layer 140. The bonding layer 145 includes at least one layer. For example, the bonding layer 145 may include a plurality of conductive layers.

The bonding layer 145 may include a metal material such as a barrier metal or a bonding metal. For example, the bonding layer 145 may include at least one of Ti, Au, Sn, Ni, Cr, Ga, In, Bi, Cu, Ag, and Ta. The bonding layer 145 may include different conductive layers. However, the bonding layer 145 is not limited thereto. The bonding layer 145 includes the first bonding layer 145A and a second bonding layer 145B. The first bonding layer 145A is disposed between the conductive layer 140 and the second bonding layer 145B, and the second bonding layer 145B is disposed between the support member 150 and the first bonding layer 145A. The first bonding layer 145A and the second bonding layer 145B are bonded together and electrically connected to the conductive layer 140, for example, the reflective layer of the conductive layer 140.

The thickness of the first bonding layer 145A may be equal to or different from the thickness of the second bonding layer 145B. The thicknesses may be varied according to bonding, heat conductivity, and conductivity characteristics.

At least one of the first bonding layer 145A and the second bonding layer 145B may be wider than at least the light emitting structure layer 135. For example, the second bonding layer 145B closer to the support member 150 may be wider than at least the light emitting structure layer 135. The width of the bonding layer 145 may be 50% or more of the width of the light emitting structure layer 135.

The support member 150 may be formed of an insulating material such as $Al_2O_3$ (sapphire) and ZnO. The support member 150 may not be a growth substrate. In the following descriptions of embodiments, an explanation will be given on an exemplary case where the support member 150 is an insulating substrate such as a sapphire substrate. The insulating substrate may include a transparent or opaque material. The thickness of the support member 150 may be in the range from about 10 µm to about 500 µm, but is not limited thereto. The support member 150 may be wider than at least the light emitting structure layer 135.

The insulting members 160 and 165, the first electrodes 171 and 173, and the second electrode 183 are disposed on side surfaces of the light emitting device 100.

A stepped structure 163 is formed on at least a side surface of the light emitting structure layer 135. The stepped structure 163 may extend from a lower portion of side surface of the second conductive type semiconductor layer 130 to a lower portion of the first conductive type semiconductor layer 110.

The first insulating member 160 may disposed at the stepped structure 163 disposed on at least a side surface of the light emitting structure layer 135. The first insulating member 160 may extend to a side surface of the bonding layer 145. The inner portion of the first insulating member 160 may be disposed more inward than the outer side surface of the light emitting structure layer 135. That is, the first insulating member 160 may be embedded or accommodated in the light emitting structure layer 135. In addition, a side surface of the first insulating member 160 may be placed on the same plane as the outer side surface of the light emitting structure layer 135. For example, the side surface of the first insulating member 160 may be placed on the same plane as a first side surface. In addition, an outer side surface of the first insulating member 160 may be stepped from the outer side surface of the light emitting structure layer 135.

The first insulating member 160 is disposed among the light emitting structure layer 135, the conductive layer 140, the bonding layer 145, and the first electrodes 171 and 173 to prevent the first electrodes 171 and 173 from making contact with other layers. The first insulating member 160 may be formed of an insulating material such as $SiO_2$, $SiO_x$, $SiO_xN_y$, $Si_3N_4$, $Al_2O_3$, and $TiO_2$, but is not limited thereto. The first insulating member 160 includes a first insulating layer 160A and a second insulating layer 160B. The first insulating layer 160A is disposed at sides of the first bonding layer 145A, the conductive layer 140, the second conductive type semiconductor layer 130, and the active layer 120. The topside of the first insulating layer 160A may be higher than the topside of the active layer 120 and extend to an inner portion of the first conductive type semiconductor layer 110.

The second insulating layer 160B of the first insulating member 160 may be disposed under the first insulating layer 160A at a side of the second bonding layer 145B.

The first insulating member 160 may further include a third insulating layer 162. The third insulating layer 162 may be disposed in a perimeter region between the second conductive type semiconductor layer 130 and the bonding layer 145. The third insulating layer 162 may have a loop shape such as a circular or polygonal shape. The third insulating layer 162 of the first insulating member 160 may make contact with the lower surface of the second insulating member 165, but is not limited thereto.

The second insulating member 165 is formed at a side of the light emitting structure layer 135 to prevent an inter-layer short circuit of the light emitting structure layer 135. The second insulating member 165 may be formed on the side surface of the light emitting structure layer 135 except for regions of the first electrodes 171 and 173. However, the second insulating member 165 is not limited thereto.

A portion of the second insulating member 165 may extend on the top surface of the first conductive type semiconductor layer 110, and in this case, the second insulating member 165 may not be easily peeled off from the side surface of the light emitting structure layer 135.

The first electrodes 171 and 173 may include a first connection electrode 171 and a second connection electrode 173. The first connection electrode 171 is connected between the first conductive type semiconductor layer 110 and the second connection electrode 173, and the second connection electrode 173 is connected between the first pad 175 and the first connection electrode 171. The first connection electrode 171 may be defined as an upper electrode, and the second connection electrode 173 may be defined as a lower electrode.

The first connection electrode 171 is connected to at least one of the top and side surfaces of the first conductive type semiconductor layer 110. The first connection electrode 171 extends to the side surface of the first insulating layer 160A of the first insulating member 160. The first connection electrode 171 may extend from the top surface to the side surface of the first conductive type semiconductor layer 110. The top surface of the first conductive type semiconductor layer 110 may be an N-face and make contact with an upper portion 171A of the first connection electrode 171.

The upper portion 171A of the first connection electrode 171 may have a branch structure and make contact with at least an edge region of the top surface of the first conductive type semiconductor layer 110. For example, the upper portion 171A may have a branch structure such as a bridge structure, an arm structure, or a finger structure. The first connection electrode 171 may include an ohmic contact layer for contact with the first conductive type semiconductor layer 110.

The width T1 of the upper portion 171A of the first connection electrode 171 may equal to or smaller than the width of the first insulating layer 160A of the first insulating member 160. In this case, a current may be diffused at the first insulating layer 160A of the first insulating member 160. However, the scope of the present disclosure is not limited thereto. The upper portion 171A of the first connection electrode 171 may extend on the light extraction structure 112. However, the scope of the present disclosure is not limited thereto.

The second connection electrode 173 is connected to the lower side of the first connection electrode 171. The second connection electrode 173 extends from the side surface of the second insulating layer 160B of the first insulating member 160 to the side surface of the support member 150 and the side surface of the first pad 175. The lower side of the second connection electrode 173 may extend to the lower surface of the support member 150. In this case, the second connection electrode 173 may be used as the first pad 175. That is, the second connection electrode 173 and the first pad 175 may be formed of the same metal layer. However, the scope of the present disclosure is not limited thereto.

The height of the first connection electrode 171 may be greater than the thickness of the light emitting structure layer 135, and the height of the second connection electrode 173 may be greater than the thickness of the support member 150. The first connection electrode 171 may be narrower than the second connection electrode 173. In this case, light extraction efficiency may not be decreased owing to the first connection electrode 171.

At least a portion of the first connection electrode 171, for example, at least the upper portion 171A of the first connection electrode 171 may be disposed at a side of the light emitting structure layer 135 opposite to the conductive layer 140.

The first connection electrode 171 and the second connection electrode 173 may be formed into a single-layer or multilayer structure by using one or more of Cr, Ti, Al, In, Ta, Pd, Co, Ni, Si, Ge, Ag, Cu, and Au. The first connection electrode 171 may be formed of a material selected from the above-listed materials in consideration of ohmic contact, contact between metal layers, reflection characteristics, conductivity characteristics, etc.

The first pad 175 and the second pad 185 may be used as lead electrodes or bonding layers.

The second electrode 183 is disposed on side surfaces of the bonding layer 145 and the support member 150 to connect the second pad 185 and the bonding layer 145. The lower side of the second electrode 183 may extend to the lower surface of the support member 150. In this case, the second electrode 183 may be used as the second pad 185. The second pad 185 may be a portion of the second electrode 183 or a portion separate from the second electrode 183.

The second electrode 183 may be formed into a single-layer or multilayer structure by using at least one of Ti, Al, Al alloy, In, Ta, Pd, Co, Ni, Si, Ge, Ag, Ag alloy, Au, Hf, Pt, Ru, Au, and an alloy thereof. However, the scope of the present disclosure is not limited thereto.

The first electrodes 171 and 173 may be disposed at a side opposite to the second electrode 183, or the first electrodes 171 and 173 and the second electrode 183 may be disposed at positions spaced apart from each other.

The second pad 185 and the first pad 175 may be disposed on the lower surface of the support member 150 at positions spaced apart from each other. For example, the second pad 185 and the first pad 175 may be disposed at opposite sides on the lower surface of the support member 150. The second connection electrode 173 may be disposed on a first side surface of the support member 150, and the second electrode 183 may be disposed on a second side surface of the support member 150. The first pad 175 may be disposed under the first side surface of the support member 150, and the second pad 185 may be disposed under the second side surface of the support member 150. The first and second side surfaces of the support member 150 may be opposite or different surfaces.

Since the different pads 175 and 185 are disposed under the support member 150 of the light emitting device 100, it may be unnecessary to dispose a pad on the light emitting structure layer 135. Thus, light loss can be reduced when light is emitted through the topside of the light emitting structure layer 135. In addition, since the first and second pads 175 and 185 are disposed under the support member 150, wire bonding may be unnecessary, and thus there may be no light loss caused by wire bonding.

FIGS. 2 to 7 are views for explaining processes of manufacturing the light emitting device 100 of FIG. 1.

Figure 2:
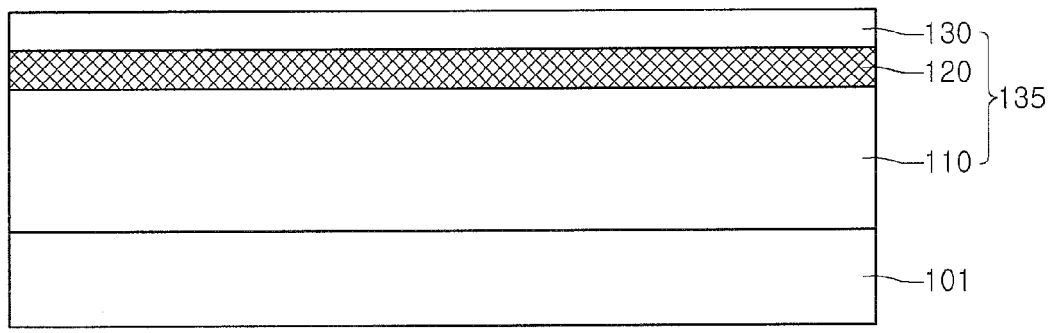
FIGS. 2 to 7 are views for explaining processes of manufacturing the light emitting device of FIG. 1.

Referring to FIG. 2, a substrate 101 may be loaded on growth equipment, and a layer or pattern may be formed on the substrate 101 by using a group II to VI compound semiconductor.

Examples of the growth equipment includes an E-beam evaporator equipment, physical vapor deposition (PVD) equipment, chemical vapor deposition (CVD) equipment, plasma laser deposition (PLD) equipment, a dual-type thermal evaporator, sputtering equipment, and metal organic chemical vapor deposition (MOCVD) equipment. However, the growth equipment is not limited thereto.

The substrate 101 may be a conductive or insulating substrate formed of a material selected from the group consisting of $Al_2O_3$ (sapphire), GaN, SiC, ZnO, Si, GaP, InP, $Ga_2O_3$, and GaAs. The substrate 101 may be a growth substrate.

A light extraction structure or a concave-convex structure having a shape such as a lens or stripe shape may be formed on the top surface of the substrate 101. In addition, a compound semiconductor layer may be formed on the substrate 101. The compound semiconductor layer may be a layer or pattern formed of a group II to VI compound semiconductor. For example, at least one of a ZnO layer, a buffer layer, and an undoped semiconductor layer may be formed. The buffer layer or the undoped semiconductor layer may be formed of an III-V compound semiconductor. The buffer layer may reduce a lattice mismatch between a GaN material and the substrate material. The buffer layer may be formed of at least one of GaN, InN, AlN, InGaN, AlGaN, InAlGaN, and AlInN. The buffer layer may have a super lattice structure in which different semiconductor layers are alternately stacked. The buffer layer may have at least two periods of, for example, InGaN/GaN. The buffer layer may reduce a lattice defect transferred from the substrate 101.

The undoped semiconductor layer may be disposed on the substrate 101 or the buffer layer. For example, the undoped semiconductor layer may be an undoped nitride-based semiconductor layer which is intentionally not doped with a conductive type dopant. The undoped semiconductor layer may be a semiconductor layer having a conductivity significantly lower than that of a first conductive type semiconductor layer. For example, the undoped semiconductor layer may be an undoped GaN layer and have a first conductive type characteristic. In the following description, a first conductive type semiconductor layer 110 will be formed on the substrate 101 as an example.

A light emitting structure layer 135 may be formed on the substrate 101. The light emitting structure layer 135 may be formed of a group III-V compound semiconductor and include at least three layers. At least two of the at least three layers may include different type dopants.

The light emitting structure layer 135 may include a first conductive type semiconductor layer 110, an active layer 120, and a second conductive type semiconductor layer 130. Another semiconductor layer may be further disposed on or under each of the layers. However, the scope of the present disclosure is not limited thereto.

The first conductive type semiconductor layer 110 is disposed on the substrate 101, and the active layer 120 is disposed on the first conductive type semiconductor layer 110. The second conductive type semiconductor layer 130 is disposed on the active layer 120.

The first conductive type semiconductor layer 110 may be formed of a group III-V compound semiconductor such as GaN, AlN, AlGaN, InGaN, InN, InAlGaN, AlInN, AlGaAs, GaP, GaAs, GaAsP, and AlGaInP. The first conductive type semiconductor layer 110 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 110 may be an N-type semiconductor layer. The N-type semiconductor layer may include an N-type dopant as a first conductive type dopant, such as Si, Ge, Sn, Se, and Te.

The first conductive type semiconductor layer 110 may have a super lattice structure in which semiconductor layers having different band gaps are stacked. The super lattice structure includes a structure such as a GaN/InGaN structure or a GaN/AlGaN structure. The super lattice structure may include a structure in which at least two pairs of different layers each having a thickness of about several angstroms (Å) or more are alternately stacked.

The first conductive type semiconductor layer 110 may include a low conductive layer and a high conductive layer that have different dopant concentrations. For example, the low conductive layer may be disposed closer to the active layer 120 than the high conductive layer. In this structure, a current applied to the high conductive layer may be diffused by the low conductive layer.

The active layer 120 may have one of a single quantum well structure, a multi quantum well structure, a quantum wire structure, and a quantum dot structure. The active layer 120 may include a period of well layer/barrier layer and be formed of a group III-V compound semiconductor material. For example, the active layer 120 may have at least one of an InGaN/GaN structure, an InGaN/AlGaN structure, and an InGaN/InGaN structure. The barrier layer may be formed of a material having a band gap greater than that of the well layer, but is not limited thereto.

A conductive clad layer may be formed on and/or under the active layer 120. The conductive clad layer may be formed of a GaN-based semiconductor or a material having a band gap greater than that of the active layer 120.

The second conductive type semiconductor layer 130 is formed on the active layer 120. The second conductive type semiconductor layer 130 may include a group III-V compound semiconductor doped with a second conductive type dopant. If the second conductive type semiconductor layer 130 is a P-type semiconductor layer, the second conductive type semiconductor layer 130 may be formed of one of compound semiconductors such as GaN, InN, AlN, InGaN, AlGaN, InAlGaN, and AlInN. The second conductive type dopant may include a P-type dopant such as Mg, Zn, Ca, Sr, and Ba.

The second conductive type semiconductor layer 130 may be formed in a single-layer or multilayer structure, but is not limited thereto.

The second conductive type semiconductor layer 130 may be formed of a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 130 may have a single-layer or multilayer structure. When the second conductive type semiconductor layer 130 has a multilayer structure, the second conductive type semiconductor layer 130 may have a super lattice structure such as an AlGaN/GaN structure or a stacked structure of layers having different dopant concentrations.

The first conductive type semiconductor layer 110, the active layer 120, and the second conductive type semiconductor layer 130 may be defined as the light emitting structure layer 135. In addition, a third conductive type semiconductor layer having a polarity opposite to that of the second conductive type may be formed on the second conductive type semiconductor layer 130. Also, the first conductive type semiconductor layer 110 may be formed as a P-type semiconductor layer, and the second conductive type semiconductor layer 130 may be formed as an N-type semiconductor layer. The light emitting structure layer 135 may have at least one of an N-P junction structure, a P-N junction structure, an N-P-N junction structure, and a P-N-P junction structure. Hereinafter, a structure in which the second conductive type semiconductor layer 130 is the uppermost layer of the light emitting structure layer 135 will be described as an example.

Figure 3:
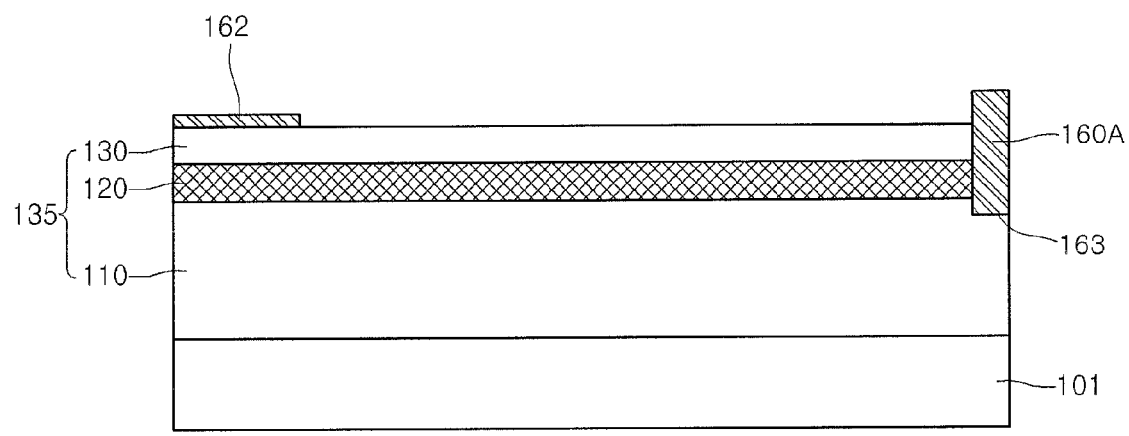
Figure 4:
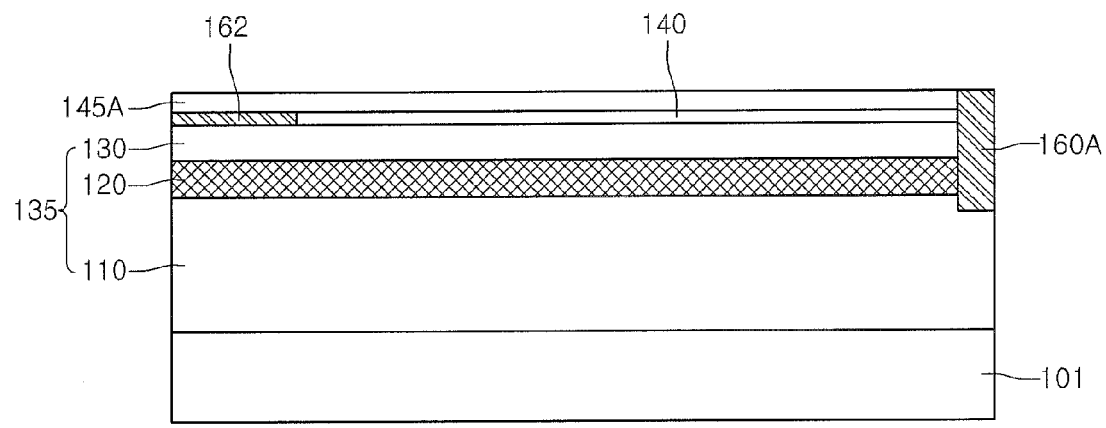

Referring to FIGS. 3 and 4, a stepped structure 163 may be formed on at least a side of the light emitting structure layer 135. The stepped structure 163 is lower than the top surface of the second conductive type semiconductor layer 130. The depth of the stepped structure 163 may be adjusted so that an upper portion of the first conductive type semiconductor layer 110 can be exposed through the second conductive type semiconductor layer 130. The stepped structure 163 may be formed by a dry and/or wet etch method, but is not limited thereto.

A first insulating layer 160A is formed in the stepped structure 163, and a third insulating layer 162 is formed on the perimeter of the top surface of the second conductive type semiconductor layer 130. The first insulating layer 160A and the third insulating layer 162 may be formed by forming a mask pattern through a photoresist process and then operating a deposition or sputtering apparatus. However, the forming method of the first insulating layer 160A and the third insulating layer 162 are not limited thereto. The first insulating layer 160A and the third insulating layer 162 may be formed of a material selected from $SiO_2$, $SiO_x$, $SiO_xN_y$, $Si_3N_4$, $Al_2O_3$, and $TiO_2$, but are not limited thereto.

The first insulating layer 160A is formed on the upper portion of the first conductive type semiconductor layer 110, a side surface of the active layer 120, and a side surface of the second conductive type semiconductor layer 130. The top side of the first insulating layer 160A may protrude from the top surface of the second conductive type semiconductor layer 130.

The third insulating layer 162 may be formed into a circular or polygonal shape along the perimeter of the top surface of the second conductive type semiconductor layer 130. The shape of the third insulating layer 162 may be a continuous or discontinuous loop shape.

A conductive layer 140 may be formed on the second conductive type semiconductor layer 130. The conductive layer 140 may be formed by using a sputtering and/or plating apparatus, but is not limited thereto.

The conductive layer 140 may include a contact layer that makes electrical contact with the second conductive type semiconductor layer 130. The conductive layer 140 may include at least one conductive layer such as an ohmic contact layer and/or a reflective layer. The ohmic contact layer may be a layer or a plurality of patterns. The ohmic contact layer may include at least one of a metal, an oxide, and a nitride. For example, the ohmic contact layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, Ni/IrOx/Au/ITO, Pt, Ni, Au, Rh, and Pd. The reflective layer may formed into a single-layer structure or a multilayer structure by using at least one of Ag, Ni, Al, Rh, Pd, Ir, Ru, Mg, Zn, Pt, Au, and Hf, or an alloy including at least two of them. The reflective layer may be formed on the ohmic contact layer and have a width greater than at least the width of the ohmic contact layer. In this case, reflection efficiency may be improved.

A portion of the conductive layer 140 may extend to the top surface of the third insulating layer 162. However, the scope of the present disclosure is not limited thereto.

In addition, a conductive or insulating pattern may be formed between the conductive layer 140 and the second conductive type semiconductor layer 130 by using an oxide. In this case, a resistance difference between contact regions of the conductive layer 140 and the second conductive type semiconductor layer 130 may be reduced.

A first bonding layer 145A may be formed on the conductive layer 140. The first bonding layer 145A may extend on the top surface of the third insulating layer 162. The first bonding layer 145A may be formed by using a sputtering apparatus, a deposition apparatus, and/or a plating apparatus. The first bonding layer 145A may include a barrier or bonding metal. For example, the first bonding layer 145A may include at least one of Ti, Au, Sn, Ni, Cr, Ga, Bi, Cu, Ag, and Ta, but is not limited thereto.

The width of the first bonding layer 145A may be greater than at least the width of the conductive layer 140, but is not limited thereto.

Figure 5:
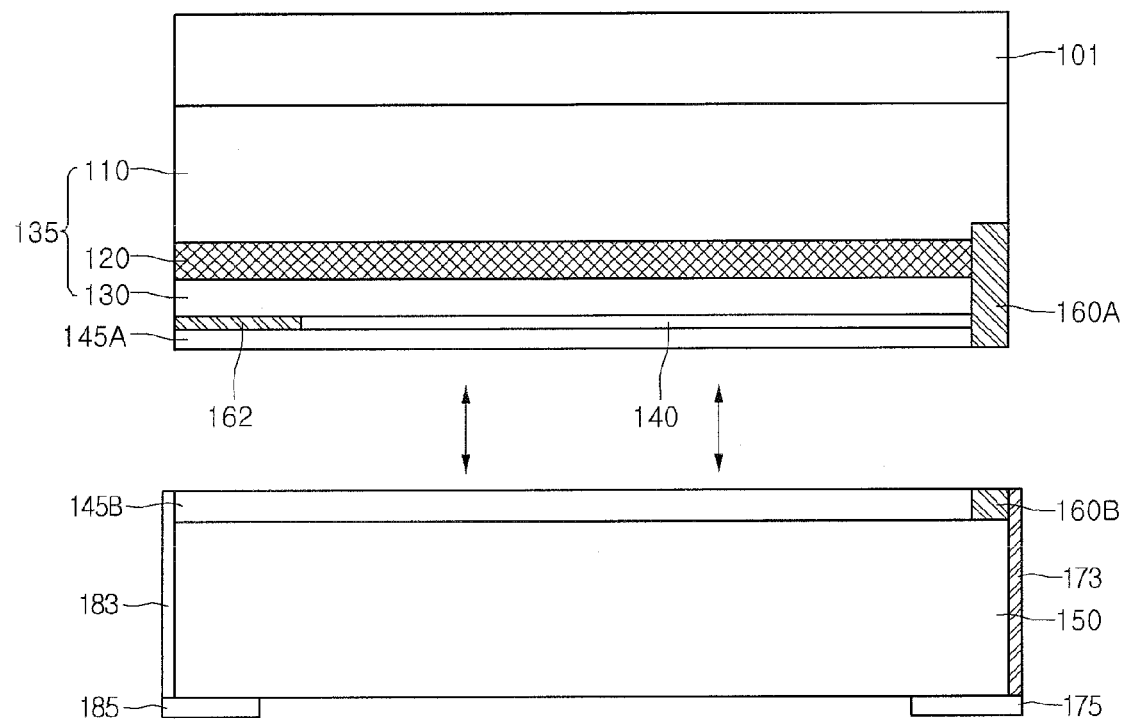

Referring to FIGS. 4 and 5, the structure shown in FIG. 4 is turned over to place the light emitting structure layer 135 above the support member 150.

The support member 150 may be an insulating substrate such as a substrate formed of $Al_2O_3$ (sapphire) or ZnO. The support member 150 may be formed of a material having a thermal expansion coefficient similar to that of a semiconductor, or the support member 150 may be formed of the same material as that used to form the substrate 101.

A second bonding layer 145B may be foamed on the support member 150. The second bonding layer 145B may include a barrier or bonding metal. For example, the second bonding layer 145B may include at least one of Ti, Au, Sn, Ni, Cr, Ga, In, Bi, Cu, Ag, and Ta, but is not limited thereto.

A second insulating layer 160B may be formed on an upper outer side of the support member 150. The second insulating layer 160B may be formed by forming a mask pattern through a photoresist process and operating a sputtering and/or deposition apparatus. The second insulating layer 160B may be formed of a material such as $SiO_2$, $SiO_x$, $SiO_xN_y$, $Si_3N_4$, $Al_2O_3$, and $TiO_2$, but is not limited thereto.

The second insulating layer 160B may be disposed between a second connection electrode 173 and the second bonding layer 145B to prevent physical contact therebetween.

The second connection electrode 173 and a first pad 175 are disposed on a side of the support member 150, and a second electrode 183 and a second pad 185 are disposed on the other side of the support member 150. The second connection electrode 173 and the second electrode 183 are disposed on different sides of the support member 150. The heights of the second connection electrode 173 and the second electrode 183 may be greater than at least the thickness of the support member 150 and may have a vertical connection structure. The second connection electrode 173 and the second electrode 183 may be formed by using through-holes formed in the support member 150. However, the scope of the present disclosure is not limited thereto. The through-holes may be formed by using a drill or laser.

The second connection electrode 173 extends from a first side surface of the support member 150 to a side surface of the second insulating layer 160B, and the second electrode 183 extends from a second side surface of the support member 150 to a side surface of the second bonding layer 145B. The first and second side surfaces of the support member 150 may be opposite or different surfaces.

The first pad 175 and the second pad 185 may be disposed on the lower surface of the support member 150 at different regions. The first pad 175 and the second pad 185 are lead electrodes or bonding layers used to receive power.

The first pad 175 is connected to the second connection electrode 173, and the second pad 185 is connected to the second electrode 183. The second electrode 183 is connected to the side surface of the second bonding layer 145B.

The electrodes 173 and 183 and the pads 175 and 185 may be formed on the support member 150 after the support member 150 is bonded to the substrate 101 or chips are separated. However, the scope of the present disclosure is not limited thereto.

Figure 6:
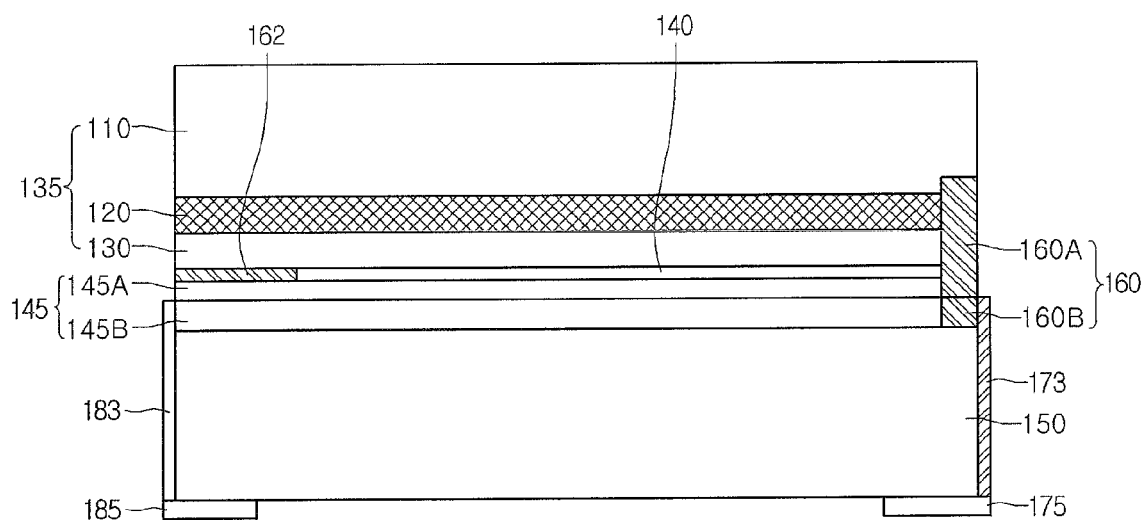

The support member 150 and the light emitting structure layer 135 are correspondingly positioned and are bonded to each other as shown in FIG. 6.

At this time, the second bonding layer 145B corresponds to the first bonding layer 145A, and the second insulating layer 160B corresponds to the first insulating layer 160A.

Referring to FIGS. 5 and 6, the first bonding layer 145A and the second bonding layer 145B are bonded to each other and electrically connected. In addition, the first insulating layer 160A and the second insulating layer 160B are bonded to each other to form a first insulating member 160.

Then, the substrate 101 may be removed by a physical and/or chemical method. The substrate 101 may be removed by a physical method such as laser lift off (LLO) method in which a laser beam having a predetermined wavelength region is irradiated to the substrate 101. If another semiconductor layer (such as a buffer layer) is formed between the substrate 101 and the first conductive type semiconductor layer 110, the substrate 101 may be removed by removing the buffer layer using an etchant. An inductively coupled plasma (IPC)/reactive ion etching (RIE) process may be performed on a surface of the first conductive type semiconductor layer 110 after the substrate 101 is removed from the surface of the first conductive type semiconductor layer 110. However, the scope of the present disclosure is not limited thereto.

Then, the conductive layer 140 is disposed under the second conductive type semiconductor layer 130, the bonding layer 145 is disposed under the conductive layer 140, and the support member 150 is disposed under the bonding layer 145. The bonding layer 145 connects the conductive layer 140 and the second electrode 183.

Figure 7:
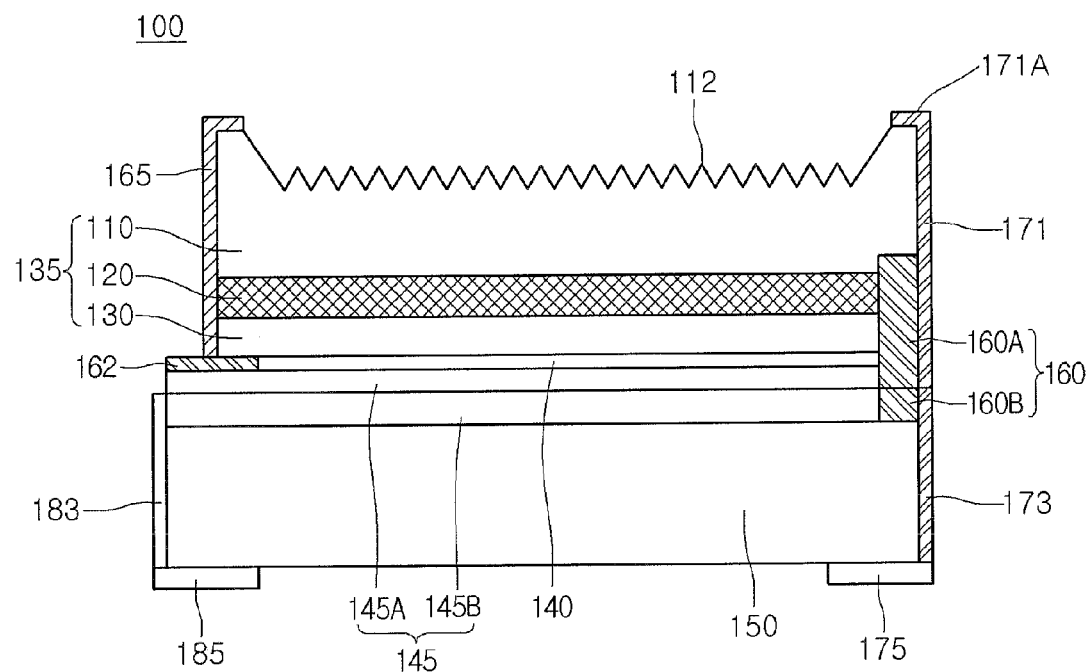

Referring to FIGS. 6 and 7, the third insulating layer 162 is exposed by performing an etching process along the edge region of the light emitting structure layer 135. A second insulating member 165 is formed around the light emitting structure layer 135. The second insulating member 165 may extend from the top surface of the third insulating layer 162 to a periphery portion of a top surface of the first conductive type semiconductor layer 110. The etching process may include a dry etching process and/or a wet etching process. Boundaries for separating chips may be etched away through the etching process.

A first connection electrode 171 may be formed on a side of the light emitting structure layer 135. The first connection electrode 171 may make contact with the upper end of the second connection electrode 173 and may extend to the top surface of the first conductive type semiconductor layer 110. The first connection electrode 171 may be formed into a single-layer or multilayer structure by using one or more of Cr, Ti, Al, In, Ta, Pd, Co, Ni, Si, Ge, Ag, Cu, and Au. The first connection electrode 171 may be formed of a material selected from the above-listed materials in consideration of ohmic contact, bonding between metal layers, reflection characteristics, conductivity characteristics, etc.

The first connection electrode 171 may have a split structure such as a branch structure, a bridge structure, a radial structure, an arm structure, and a finger structure. The split structure may make contact with at least an edge region of the top surface of the first conductive type semiconductor layer 110. The split structure of the first connection electrode 171 may make contact with the top surface of the first conductive type semiconductor layer 110 through different regions for uniformly supplying a current and preventing concentration of the current.

The first and second connection electrodes 171 and 173 connect the first conductive type semiconductor layer 110 and the first pad 175.

The first insulating layer 160A prevents the first connection electrode 171 from making contact with other layers (120, 130, 145A).

A light extraction structure 112 may be fall red at the top surface of the first conductive type semiconductor layer 110 by a dry etching process or a wet etching process. The light extraction structure 112 may include regular or irregular sizes. The light extraction structure 112 may include a pattern such as a rough pattern, a concave-convex pattern, and a texture pattern. The light extraction structure 112 may change the critical angle of incident light.

The first pad 175 is electrically connected to the first conductive type semiconductor layer 110 through the second connection electrode 173 and the first connection electrode 171. The second pad 185 is electrically connected to the second conductive type semiconductor layer 130 through the second electrode 183, the bonding layer 145, and the conductive layer 140.

The second connection electrode 173, the first pad 175, the second electrode 183, and the second pad 185 may be previously formed on the support member 150, or they may be formed together with the first connection electrode 171.

A current diffusion layer including a transparent oxide or nitride may be formed on the first conductive type semiconductor layer 110. For example, the current diffusion layer may be formed of a material such as ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, and Ni/IrOx/Au/ITO.

The current diffusion layer may be disposed between the first conductive type semiconductor layer 110 and an upper portion of the first connection electrode 171 for diffusing a current to the entire region of the first conductive type semiconductor layer 110.

Figure 8:
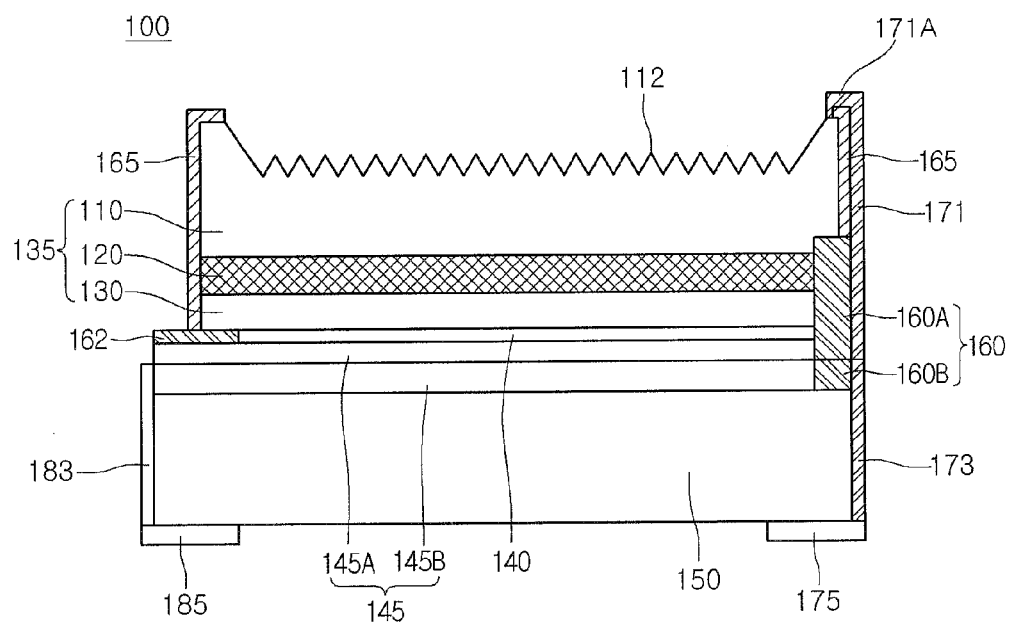
FIG. 8 is a side sectional view illustrating a light emitting device according to a second embodiment.

FIG. 8 is a side sectional view illustrating a light emitting device 100 according to a second embodiment. In the following description of FIG. 8, the same explanation as that given in the description of the first embodiment will not be repeated.

Referring to FIG. 8, the light emitting device 100 further includes a second insulating member 165 between a first connection electrode 171 and a light emitting structure layer 135. The second insulating member 165 prevents a side surface of the light emitting structure layer 135 from making contact with the first connection electrode 171.

The second insulating member 165 may be formed on the side surface of the light emitting structure layer 135 partially or entirely. However, the scope of the present disclosure is not limited thereto.

The second insulating member 165 may extend to the top surface of a first conductive type semiconductor layer 110. An upper portion 171A of the first connection electrode 171 may extend further from the stop surface of the second insulating member 165 toward the inner side of the first conductive type semiconductor layer 110 so that the upper portion 171A can make contact with the top surface of the first conductive type semiconductor layer 110.

Figure 9:
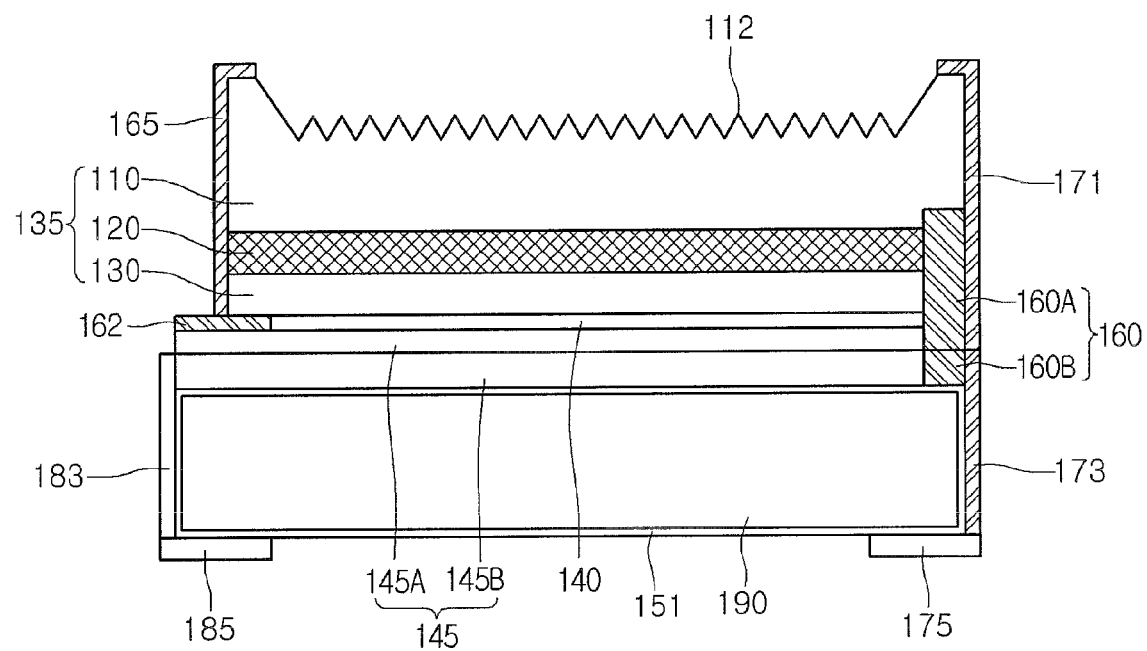
FIG. 9 is a side sectional view illustrating a light emitting device according to a third embodiment.

FIG. 9 is a side sectional view illustrating a light emitting device 100A according to a third embodiment. In the following description of FIG. 9, the same explanation as that given in the description of the first embodiment will not be repeated.

Referring to FIG. 9, the light emitting device 100A includes a conductive support member 190 and a third insulating member 151 on the conductive support member 190. The conductive support member 190 may be a silicon wafer or a semiconductor substrate formed of a material such as GaN, Si, and GaAs. Alternatively, the conductive support member 190 may be a metal substrate having a high thermal conductivity. However, the conductive support member 190 is not limited thereto.

The third insulating member 151 is formed on the conductive support member 190. The third insulating member 151 may be formed of a material such as $SiO_2$, $SiO_x$, $SiO_xN_y$, $Si_3N_4$, $Al_2O_3$, and $TiO_2$, but is not limited thereto. The third insulating member 151 insulates the conductive support member 190 from a first connection electrode 173, a first pad 175, a second electrode 183, and a second pad 185.

The third insulating member 151 is disposed between the conductive support member 190 and a second bonding layer 145B as an insulator.

The conductive support member 190 may be connected to the first pad 175 or the second pad 185. For example, the conductive support member 190 may be connected between the second pad 185 and the second bonding layer 145B. In detail, the conductive support member 190 and the second bonding layer 145B can be connected to each other by removing a region of the third insulating member 151 disposed between the conductive support member 190 and the second bonding layer 145B. In this case, the second electrode 183 may be omitted, and thus heat dissipation efficient of the light emitting device 100A may be improved.

Figure 10:
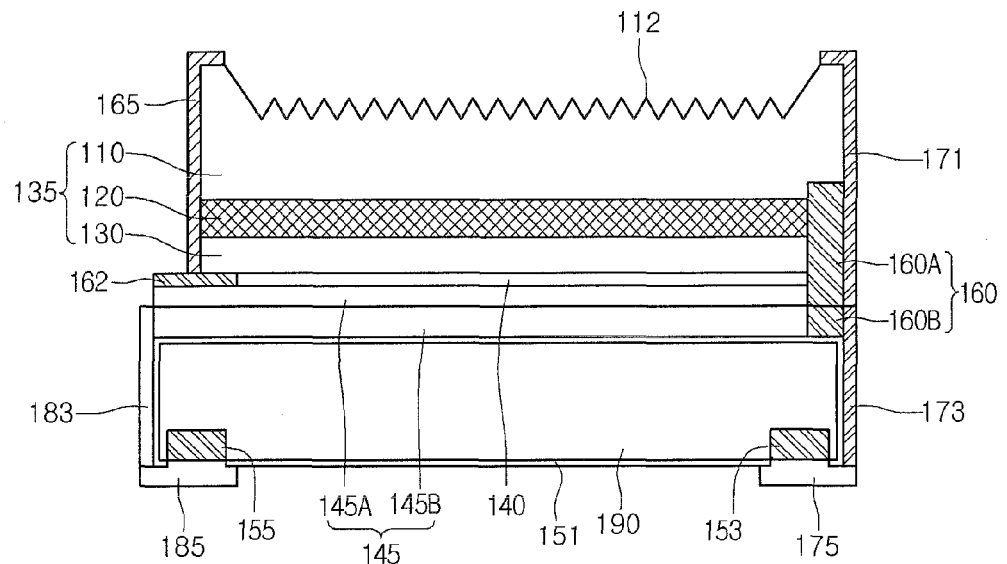
FIG. 10 is a side sectional view illustrating a light emitting device according to a fourth embodiment.

FIG. 10 is a side sectional view illustrating a light emitting device 100B according to a fourth embodiment. In the following description of FIG. 10, the same explanation as that given in the description of the first embodiment will not be repeated.

Referring to FIG. 10, the light emitting device 100B includes a conductive support member 190 and a plurality of doped regions 153 and 155 in the conductive support member 190. For example, the conductive support member 190 may be a carrier wafer such as a Si wafer. The conductive support member 190 may be used as an N-type substrate by diffusing an N-type dopant into the conductive support member 190 or doping the conductive support member 190 with an N-type dopant. Alternatively, the conductive support member 190 may be used as a P-type substrate by diffusing a P-type dopant into the conductive support member 190 or doping the conductive support member 190 with a P-type dopant.

At least one doped region may be formed in the conductive support member 190. The doped region may include a dopant having a polarity opposite to that of the conductive support member 190.

A first region of the conductive support member 190 is not covered with a third insulating member 151 and is formed as a first doped region 153. The first doped region 153 is electrically connected to a first pad 175 and the conductive support member 190 to function as a Zener diode. The first doped region 153 is a region formed by implanting or diffusing a dopant having a polarity opposite to that of the conductive support member 190. For example, if the conductive support member 190 has an N-type polarity, the first doped region 153 may have a P-type polarity. In this case, an N-P junction Zener diode may be formed.

A second region of the conductive support member 190 is not covered with the third insulating member 151 and is formed as a second doped region 155. The second doped region 155 is connected to a second pad 185 and the conductive support member 190 to function as a Zener diode. The second doped region 155 is a region formed by implanting or diffusing a dopant having a polarity opposite to that of the conductive support member 190. For example, if the conductive support member 190 has an N-type polarity, the second doped region 155 may have a P-type polarity. In this case, an N-P junction Zener diode may be formed.

The plurality of doped regions 153 and 155 connected through the conductive support member 190 may be connected in parallel to a light emitting structure layer 135 for protecting the light emitting structure layer 135 from abnormal power supply to the light emitting structure layer 135.

The first and second doped regions 153 and 155 may have a quantum well structure and may be N-type doped regions. In another example, P-type doped regions may be further included in the N-type doped regions. Such double doped regions may constitute NPN switching devices (such as thin film transistors (TFTs)). Such switching devices may protect the light emitting device 100B and control current characteristics.

Figure 11:
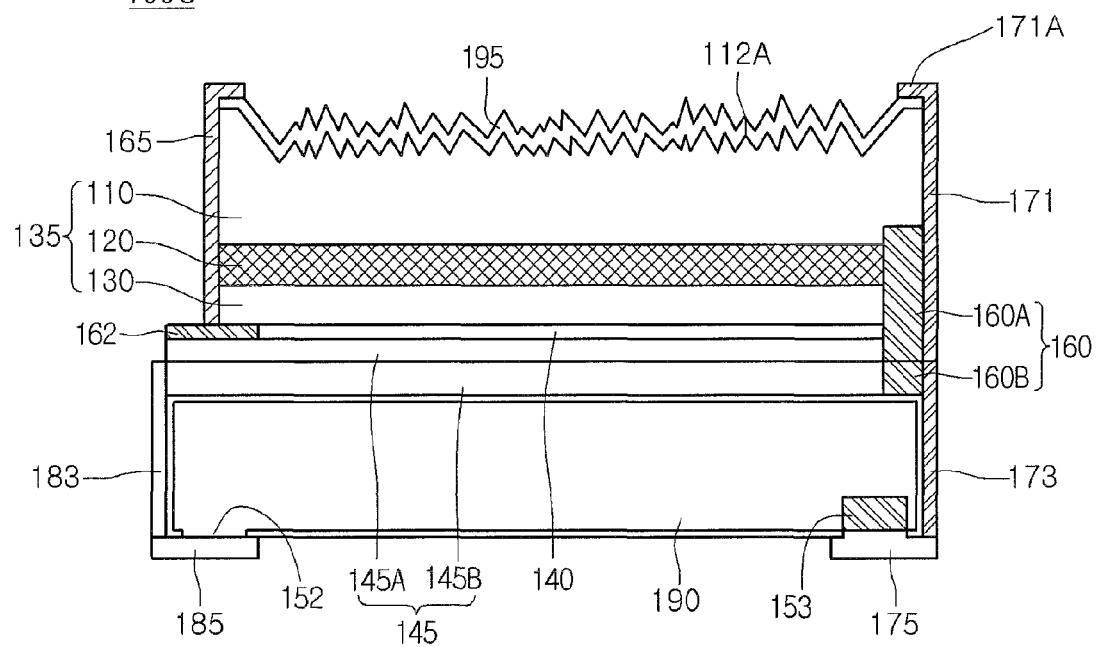
FIG. 11 is a side sectional view illustrating a light emitting device according to a fifth embodiment.

FIG. 11 is a side sectional view illustrating a light emitting device 100C according to a fifth embodiment. In the following description of FIG. 11, the same explanation as that given in the description of the previous embodiments will not be repeated.

Referring to FIG. 11, the light emitting device 100C includes a conductive support member 190 and at least one doped region 153. For example, the conductive support member 190 may be a carrier wafer such as a Si wafer. The conductive support member 190 may be used as an N-type substrate by diffusing an N-type dopant into the conductive support member 190 or doping the conductive support member 190 with an N-type dopant. Alternatively, the conductive support member 190 may be used as a P-type substrate by diffusing a P-type dopant into the conductive support member 190 or doping the conductive support member 190 with a P-type dopant.

At least one doped region 153 may be formed in the conductive support member 190. The doped region 153 may include a dopant having a polarity opposite to that of the conductive support member 190. For example, if the conductive support member 190 has an N-type polarity, the doped region 153 has a P-type polarity. In this case, an N-P junction Zener diode may be formed.

A first region of the conductive support member 190 is not covered with a third insulating member 151 so that the doped region 153 can be connected to a first pad 175. The doped region 153 is electrically connected to the first pad 175 and the conductive support member 190 to function as a Zener diode.

A second region 152 of the conductive support member 190 is not covered with the third insulating member 151 so that the conductive support member 190 can be connected to a second pad 185. The conductive support member 190 of the light emitting device 100C may include at least one Zener diode. In another example, the conductive support member 190 may connect the second pad 185 to a second bonding layer 145B.

A light extraction structure 112A may be formed on the top surface of a first conductive type semiconductor layer 110 by arranging irregular patterns randomly. The light extraction structure 112A may be formed by a wet or dry etching method to improve light extraction efficiency.

A transparent current diffusion layer 195 may be disposed on the first conductive type semiconductor layer 110. The current diffusion layer 195 may be disposed between a first connection electrode 171 and the first conductive type semiconductor layer 110. Owing to the current diffusion layer 195, a current supplied from the first connection electrode 171 may be diffused throughout the first conductive type semiconductor layer 110. Owing to the current diffusion layer 195, the first connection electrode 171 and the first conductive type semiconductor layer 110 may be spaced apart from each other, and a current supplied through the first connection electrode 171 may be diffused throughout the first conductive type semiconductor layer 110. In addition, light propagating through the top surface of the first conductive type semiconductor layer 110 can be effectively extracted.

The current diffusion layer 195 may cover at least 50% of the top surface of the first conductive type semiconductor layer 110.

For example, the current diffusion layer 195 may be formed of a material such as ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, and Ni/IrOx/Au/ITO.

Figure 12:
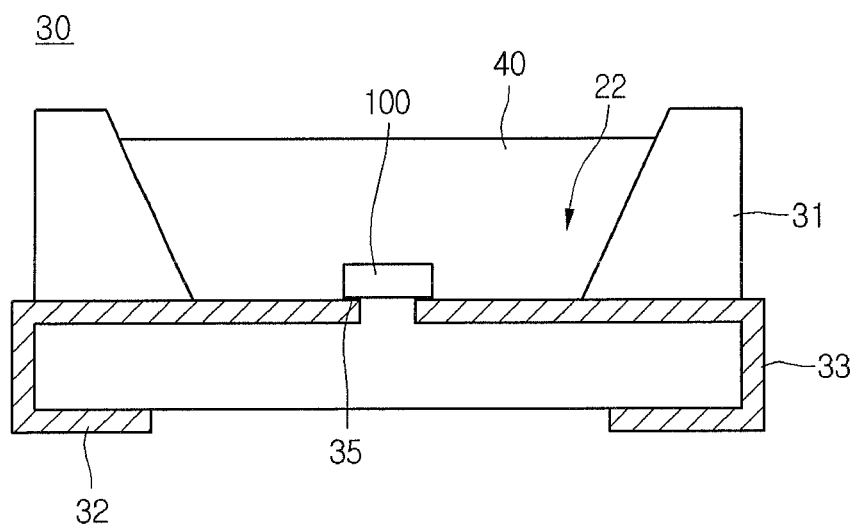
FIG. 12 is a side sectional view illustrating a light emitting device package according to a sixth embodiment.

FIG. 12 is a sectional view of a light emitting device package 30 according to an embodiment.

Referring to FIG. 12, the light emitting device package 30 includes: a body 31; first and second lead frames 32 and 33 disposed on the body 31; a light emitting device 100 configured according to the previous embodiment and disposed on the first and second lead frames 32 and 33 by soldering (35); and a molding member 40 enclosing the light emitting device 100.

The body 31 may be formed of a material such as a silicon material, a synthetic resin, and a metal. The body 31 may include a cavity 22 the topside of which is opened. The sidewall of the cavity 22 may be oblique or vertical to the lower surface of the cavity 22. For example, the cavity 22 may provide a sloped surface around the light emitting device 100.

The first and second lead frames 32 and 33 are electrically separated from each other and are configured to supply power to the light emitting device 100. The light emitting device 100 may be connected to the first and second lead frames 32 and 33 without using separate wires by a die bonding method.

A first pad of the light emitting device 100 is bonded to the second lead frame 33, and a second pad of the light emitting device 100 may be bonded to the first lead frame 32.

The first and second lead frames 32 and 33 may formed into a frame structure, or the lead frames may be formed by a plating method. However, the scope of the present disclosure is not limited thereto.

The first and second lead frames 32 and 33 may be exposed to the outside of the body 31 and may extend along the side and lower surfaces of the body 31. In another example, the first and second lead frames 32 and 33 may be formed by using via-holes or through-holes extending from the lower surface of the cavity 22 to the lower surface of the body 31.

The molding member 40 may include a transparent material such as silicon or epoxy. The molding member 40 may cover the light emitting device 100 to protect the light emitting device 100. In addition, a phosphor may be contained in the molding member 40 to change the wavelength of light emitted from the light emitting device 100. A lens may be disposed on the molding member 40. The lens may make contact with the molding member 40 or may be spaced a predetermined distance from the molding member 40. However, the scope of the present disclosure is not limited thereto.

The light emitting device of the above-described embodiment(s) may be directly bonded to a lead frame or a board without using an additional wire through a die bonding process, and then the light emitting device may be packaged by using a molding member. Although the light emitting device package is configured as a topside emitting type in the above description, the light emitting device package can be configured as a side emitting type, and the same heat-dissipation, conductivity, and reflection improvement effects can be obtained. The light emitting device package or the light emitting device may be used as a light source of an indicating device, a lighting device, or a display. Any one of the above-described embodiments is not limited to itself but can be selectively applied to the other embodiments.

The light emitting device or the light emitting device package of the embodiments may be used for a light unit. The light unit may include a structure in which plurality of light emitting device packages are arranged. Examples of the light unit include a lighting lamp, a traffic light, a headlamp of a vehicle, and an electric display board.

≦Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 13 and 14, a lighting unit shown in FIG. 15, in addition to a lighting lamp, a signal light, a vehicle headlight, an electronic display, etc.

Figure 13:
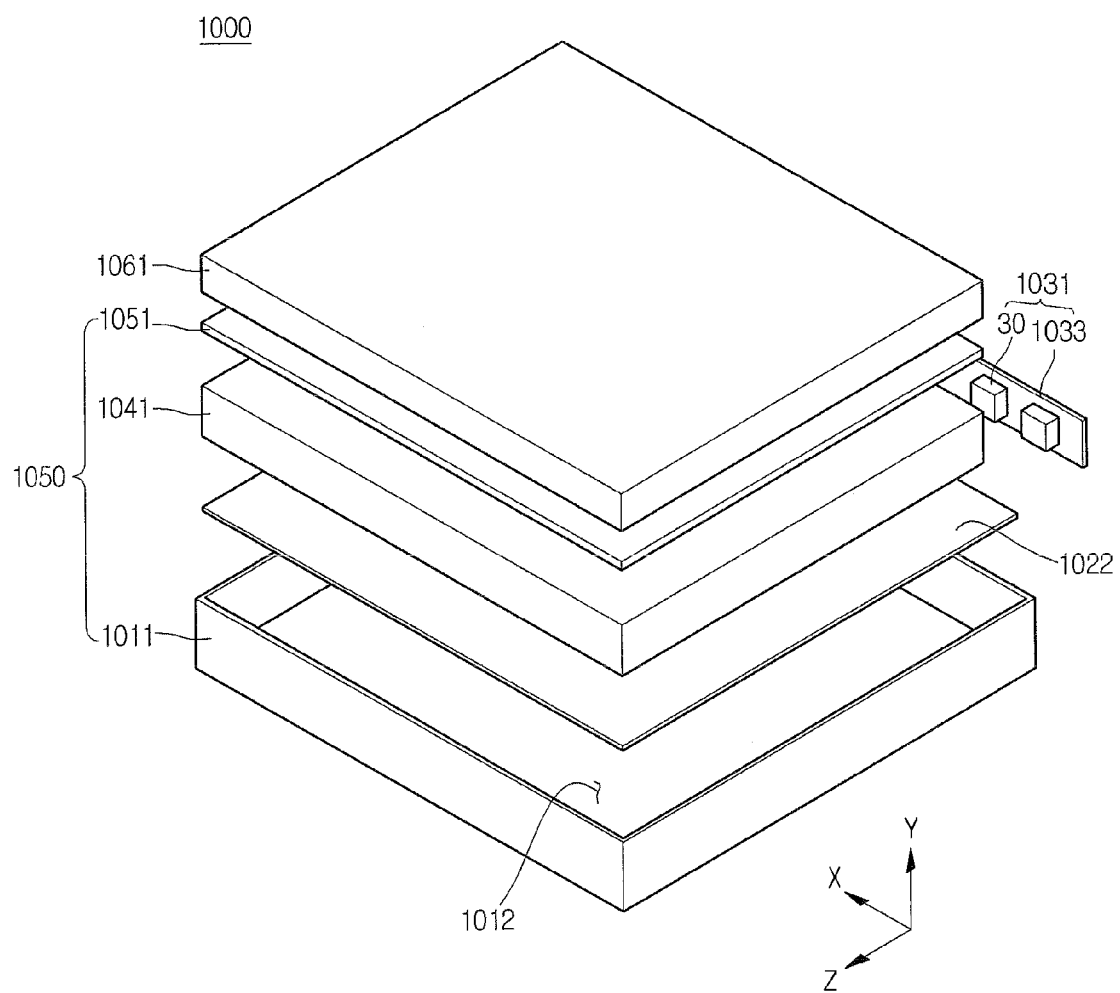
FIG. 13 is a disassembled perspective view of a display apparatus provided with the light emitting device.

FIG. 13 is a disassembled perspective view of a display apparatus according to an embodiment.

Referring to FIG. 13, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 farmed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 14:
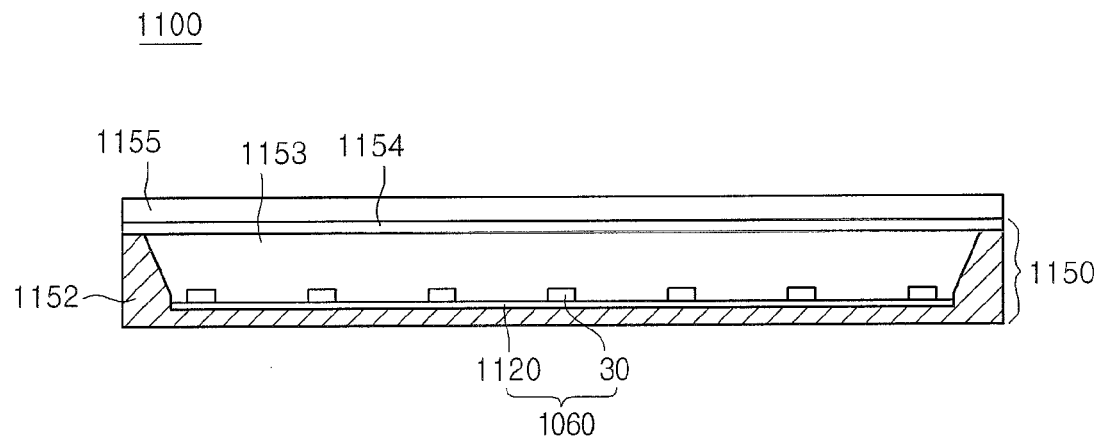
FIG. 14 is a schematic sectional view illustrating another example of a display apparatus provided with the light emitting device.

FIG. 14 is a cross-sectional view of a display apparatus according to an embodiment.

Referring to FIG. 14, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be foamed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 15:
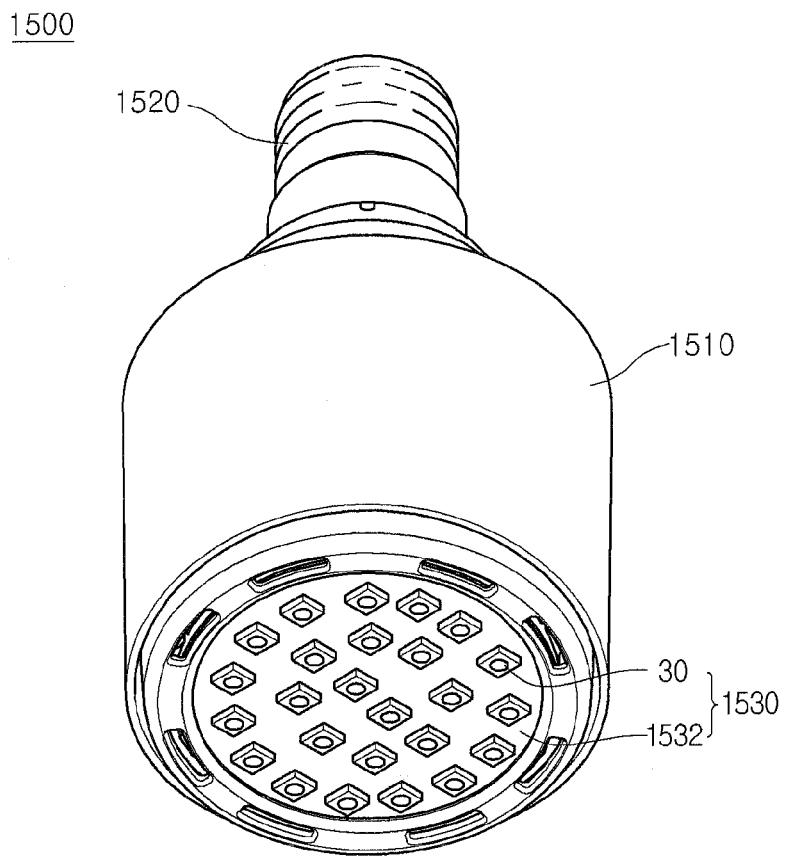
FIG. 15 is a perspective view of a lighting unit provided with the light emitting device.

FIG. 15 is a perspective view of a lighting unit according to an embodiment.

Referring to FIG. 15, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be foamed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, the light emitting device packages including the light emitting device 100 are arranged on the substrate to form the light emitting module. In addition, the light emitting devices as shown in FIG. 1 are arranged on the substrate and then packaged to form the light emitting module.

According to an embodiment, a light emitting device manufacturing method may include: forming a plurality of compound semiconductor layers on the substrate, the compound semiconductor layers including a first conductive type semiconductor layer, an active layer, and a second conductive type semiconductor layer; forming a conductive layer on the compound semiconductors; forming a first insulating layer by partially etching the conductive layer, the second conductive type semiconductor layer, and the active layer; forming a first bonding layer on the conductive layer; coupling a second bonding layer formed on a support member to the first bonding layer; removing the substrate; and forming a first connection electrode in a manner such that the first connection electrode is electrically connected to the first conductive type semiconductor layer and is disposed at an outer side of the first insulating layer.

According to the embodiments, it is unnecessary to form a pad on a semiconductor layer so that light extraction efficiency can be improved at the top surface of the semiconductor layer. According to the embodiments, a light emitting area may be less reduced as compared with in the case of a light emitting device having a lateral electrode structure. According to the embodiments, a light emitting area can be less reduced by disposing a bonding electrode under a substrate. According to the embodiments, light extraction efficiency can be improved. According to the embodiments, reliable light emitting device packages and lighting systems including light emitting devices can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure layer comprising a first conductive type semiconductor layer, an active layer under the first conductive type semiconductor layer, and a second conductive type semiconductor layer under the active layer;
    a conductive layer under the light emitting structure layer;
    a bonding layer under the conductive layer;
    a support member under the bonding layer;
    a first pad under the support member;
    a second pad under the support member at a distance from the first pad;
    a first electrode connected between the first conductive type semiconductor layer and the first pad; and
    a second electrode connected between the bonding layer and the second pad,
    a first insulating member between the first conductive type semiconductor layer and the support member,
    wherein the first electrode is disposed on a first sidewall of the support member,
    wherein the second electrode is disposed on a second sidewall of the support member.

2. The light emitting device according to claim 1, wherein the first electrode comprises:
    a first connection electrode disposed on a first side surface of the light emitting structure layer and connected to the first conductive type semiconductor layer; and
    a second connection electrode disposed on a first side surface of the support member for connecting the first connection electrode and the first pad.

3. The light emitting device according to claim 2, wherein a portion of the first connection electrode extends from a first side surface of the first conductive type semiconductor layer to a top surface of the first conductive type semiconductor layer, and
    the portion of the first conductive type semiconductor layer and the conductive layer are disposed on opposite sides of the light emitting structure layer.

4. The light emitting device according to claim 2, wherein the first insulating member is disposed between the first electrode and at least one of the conductive layer, the light emitting structure layer and the bonding layer.

5. The light emitting device according to claim 4, wherein the first insulating member is disposed inward from outer surfaces of the light emitting structure layer and the bonding layer.

6. The light emitting device according to claim 4, wherein the first insulating member includes a first portion disposed between the light emitting structure layer and the bonding layer and a second portion extended outward beyond a lower surface of the second conductive type semiconductor layer.

7. The light emitting device according to claim 2, wherein the second electrode is disposed on a second side surface of the support member, and the first and second side surfaces of the support member are different surfaces of the support members.

8. The light emitting device according to claim 7, wherein the bonding layer comprises:
   a first bonding layer on the support member; and
   a second bonding layer between the first bonding layer and the conductive layer.

9. The light emitting device according to claim 7, comprising a second insulation member on a surface of the support member, wherein the support member comprises a carrier wafer.

10. The light emitting device according to claim 1, wherein the conductive layer comprises:
    an ohmic contact layer contacted with a lower surface of the second conductive type semiconductor layer; and
    a reflective layer under the ohmic contact layer.

11. The light emitting device according to claim 1, further comprising a current diffusion layer is formed of a transparent material on the first conductive type semiconductor layer, wherein the first electrode is connected to the current diffusion layer.

12. The light emitting device according to claim 1, where a width of the bonding layer is wider than that of the conductive layer.

13. The light emitting device according to claim 1, where a width of the bonding layer is wider than that of the light emitting structure layer.

14. A light emitting device comprising:
    a light emitting structure layer comprising a first conductive type semiconductor layer, an active layer under the first conductive type semiconductor layer, and a second conductive type semiconductor layer under the active layer;
    a conductive layer under the light emitting structure layer;
    a bonding layer under the conductive layer;
    a support member under the bonding layer;
    a first pad under the support member;
    a second pad under the support member;
    a first electrode connected between the first conductive type semiconductor layer and the first pad; and
    a second electrode connected between the bonding layer and the second pad, and
    a first insulating member between the first conductive type semiconductor layer and the support member,
    wherein a width of the bonding layer is at least 50% of a width of the light emitting structure layer.

15. The light emitting device according to claim 14, further comprising at least one of a current diffusion layer disposed on the first conductive type semiconductor layer and connected to the first electrode, the current diffusion layer comprising a transparent material; and a light extraction structure on a top surface of the first conductive type semiconductor layer.

16. The light emitting device according to claim 15, wherein the first electrode comprises:
    a first connection electrode disposed on a first side surface of the light emitting structure layer and connected to the first conductive type semiconductor layer; and
    a second connection electrode disposed on a first side surface of the support member for connecting the first connection electrode and the first pad.

17. The light emitting device according to claim 14, wherein a top surface of the first conductive type semiconductor layer is an N-face and is contacted with an upper portion of the first connection electrode.

18. The light emitting device according to claim 14, wherein the support member comprises a carrier wafer comprising at least one doped region, wherein the doped region of the carrier wafer is connected to at least one of the first pad and the second pad.

19. The light emitting device according to claim 14, wherein the conductive layer comprises:
    an ohmic contact layer contacted with the second conductive type semiconductor layer; and
    a reflective layer under the ohmic contact layer,
    wherein the bonding layer comprises:
    a first bonding layer between the reflective layer and the support member; and
    a second bonding layer between the first bonding layer and the support member.

20. The light emitting device according to claim 14, wherein the first conductive type semiconductor layer comprises an N-type semiconductor layer, and the second conductive type semiconductor layer comprises a P-type semiconductor layer.

* * * * *